United States Patent
Le

(10) Patent No.: US 6,434,517 B1
(45) Date of Patent: Aug. 13, 2002

(54) METHOD AND SYSTEM FOR DEMONSTRATING SIMULATION OF A COMMUNICATIONS BUS

(75) Inventor: Tony Viet Nam Le, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/205,829

(22) Filed: Dec. 4, 1998

(51) Int. Cl.[7] .............................................. G06F 9/455
(52) U.S. Cl. .............................. 703/21; 710/126; 716/4
(58) Field of Search ............................. 703/13–15, 19, 703/21; 702/66, 67, 70, 79; 710/126, 129, 100; 716/4

(56) References Cited

U.S. PATENT DOCUMENTS

| | | | | |
|---|---|---|---|---|
| 4,873,647 A | * | 10/1989 | Banke et al. .................. | 716/1 |
| 5,731,984 A | * | 3/1998 | Ullmann ...................... | 702/67 |
| 5,907,696 A | * | 5/1999 | Stilwell et al. ............... | 703/13 |
| 6,018,807 A | * | 1/2000 | Larson ......................... | 714/33 |
| 6,123,735 A | * | 9/2000 | Raghavan et al. ............ | 703/21 |
| 6,141,634 A | * | 10/2000 | Flint et al. ..................... | 703/18 |
| 6,163,763 A | * | 12/2000 | Cox et al. ..................... | 703/17 |

OTHER PUBLICATIONS

Gope et al., "Evaluation of Power Quality in a Missle Test Range Using a PC Based Power Disturbance Analyzer", Power Quality '98, pp. 217–223, 1998.*

PCI Local Bus, "PCI Local Bus Specification" Product Version 2.1, published by PCI Special Interest Group, Jun. 1, 1995, pp. 8–117.

* cited by examiner

Primary Examiner—Russell Frejd
(74) Attorney, Agent, or Firm—LeRoy D. Maunu; Edel M. Young

(57) ABSTRACT

A method and system for demonstrating simulation of a communications bus. In various embodiments, methods and systems are described which support recording a simulation of a system having a communications bus and playback of the recorded simulation. Bus signal vectors are recorded by recorder logic during the simulation, and player logic reads the recorded signal vectors and provides the appropriate bus signals at the appropriate times during playback of the simulation.

22 Claims, 9 Drawing Sheets

METHOD AND SYSTEM FOR DEMONSTRATING SIMULATION OF A COMMUNICATIONS BUS

RELATED PATENT APPLICATIONS

This patent application is related to U.S. patent application Ser. No. 09/205,328 entitled, "METHOD AND SYSTEM FOR SIMULATING A COMMUNICATIONS BUS," by Tony Viet Nam Le, filed on Dec. 4, 1998, and assigned to the assignee of the present invention, the contents of which are incorporated herein by reference.

FIELD OF THE INVENTION

The present invention generally relates to simulation of electronic systems, and more particularly to simulating operation of a communication bus.

BACKGROUND

Many bus architectures are complicated, and therefore require an advanced simulation environment for testing. Once a design for a system is complete, it is desirable to identify and fix problems by simulating operation of the system before building the actual system. Example simulation tools include Verilog-XL from Cadence and ModelSim from Model Technology.

In addition to a simulation tool, a suitable test bench must be created which is functional with both the system design and with the simulation tool. For some popular bus architectures for which bus core logic is commercially available, a number of vendors provide test benches. The commercially available test benches relieve the user from having to recreate what others have already created.

A user planning to purchase a test bench along with the bus core logic may reasonably expect some level of assurance that the bus core logic and test bench are functional. That is, the user wants to be assured that the test bench exercises the functionality of the bus and that the bus operates correctly. One method for providing such assurance to a customer is to demonstrate the test bench in operation. However, such a demonstration requires not only a functional system design, but also the live test bench.

The complexity of a test bench, along with the popularity of a particular bus architecture, are in part what make a test environment valuable. For example, the Peripheral Component Interface (PCI) bus architecture is a relatively complicated architecture whose use is widespread. Thus, the bus core logic as well as the test benches for PCI are quite valuable.

The value of the bus core logic and test bench makes the vendor fearful of uncontrolled demonstrations of the bus core logic and test bench. For example, a vendor may be reluctant to send the test bench to a customer without some level of supervision over use of the test bench to prevent unlicensed use as well as examination by competitors. Therefore, a system and method that addresses the above identified problems would be desirable.

SUMMARY OF THE INVENTION

The present invention provides a method for demonstrating the simulation of a communications bus. In one embodiment, the method comprises simulating operation of a system that includes a communications bus, a first bus agent, a second bus agent, and recorder logic. Recorder logic records bus signals of the first and second agents as signal vectors. Playback logic is substituted for the recorder logic, and during playback the signal vectors recorded for the first and second agents are output as bus signals by the playback logic.

In another embodiment, the method includes a communications bus. The method comprises simulating operation of a system that includes a communications bus, a first bus agent, a second bus agent, and recorder logic. For each bus agent, respective base signal vectors are recorded, each base signal vector representing a set of states of the bus signals during a base interval of time. When a change in state of any of the signals of the base signal vector is detected during a second interval of time, a duration value is recorded for a duration of time between the base interval and the second interval and a new signal vector is recorded with the states of the bus signals as present during the second interval. The new signal vector is then used as the base signal vector and the second interval is used as the base interval, and the process is repeated.

According to another aspect of the invention, a system is provided for recording the simulation of a communications bus. The system comprises a simulator, bus logic, a plurality of bus agent logic elements, and a simulation controller. The bus logic defines operation of the communications bus and is hosted by the simulator. The bus agents are interfaced with the bus logic and are hosted by the simulator. Each bus agent includes recorder logic that stores signal vectors representing bus signals output by the bus agent. The simulation controller is interfaced with the plurality of bus agents and is arranged to exercise selected usage of the bus by the agents.

According to yet another aspect of the invention, a system for demonstrating a simulation of a communications bus is provided. The system comprises a simulator, bus logic, a plurality of stored signal vectors, and a plurality of player logic elements. The bus logic defines operation of the communications bus and is hosted by the simulator. Each of the plurality of stored signal vectors represents bus signals output during an associated interval of time during the simulation. The plurality of player logic elements are interfaced with the stored signal vectors and with the bus logic, and are hosted by the simulator. Each bus agent is arranged to read respectively associated ones of the signal vectors and provide the associated signal vectors as bus signals at the associated intervals of time.

In still another embodiment, an apparatus is provided for demonstrating this simulation of a communications bus. The apparatus comprises: means for simulating operation of a system including a bus and a plurality of bus agents; means for recording signal vectors respectively generated by the bus agents during simulation; means for reading during playback of the simulation the signal vectors recorded during the simulation; and means for providing as output on the bus the signal vectors read during playback.

In yet another embodiment, a method is provided that allows for both "live" and recorded agents wherein a "live" agent is one that responds to input stimuli (bus signals) and a recorded agent simply plays back a recorded signaling sequence. The method comprises simulating operation of a system that includes a communications bus, a first bus agent, a second bus agent, and recorder logic. Bus signals of the first agent are recorded as signal vectors by the recorder logic. For playback, playback logic is substituted for the recorder logic in the first bus agent, and the signal vectors recorded for the first bus agent are output as bus signals by the playback logic. The second bus agent remains live during both recording and playback. Thus both the recording and playback systems simulate the second agent's operation.

The above summary of the present invention is not intended to describe each disclosed embodiment of the present invention. The figures and detailed description that follow provide additional example embodiments and aspects of the present invention.

BRIEF DESCRIPTION OF THE DRAWINGS

The present invention is illustrated in the following figures by way of example, and not by way of limitation, in which like reference numerals refer to similar elements.

Figure 1:
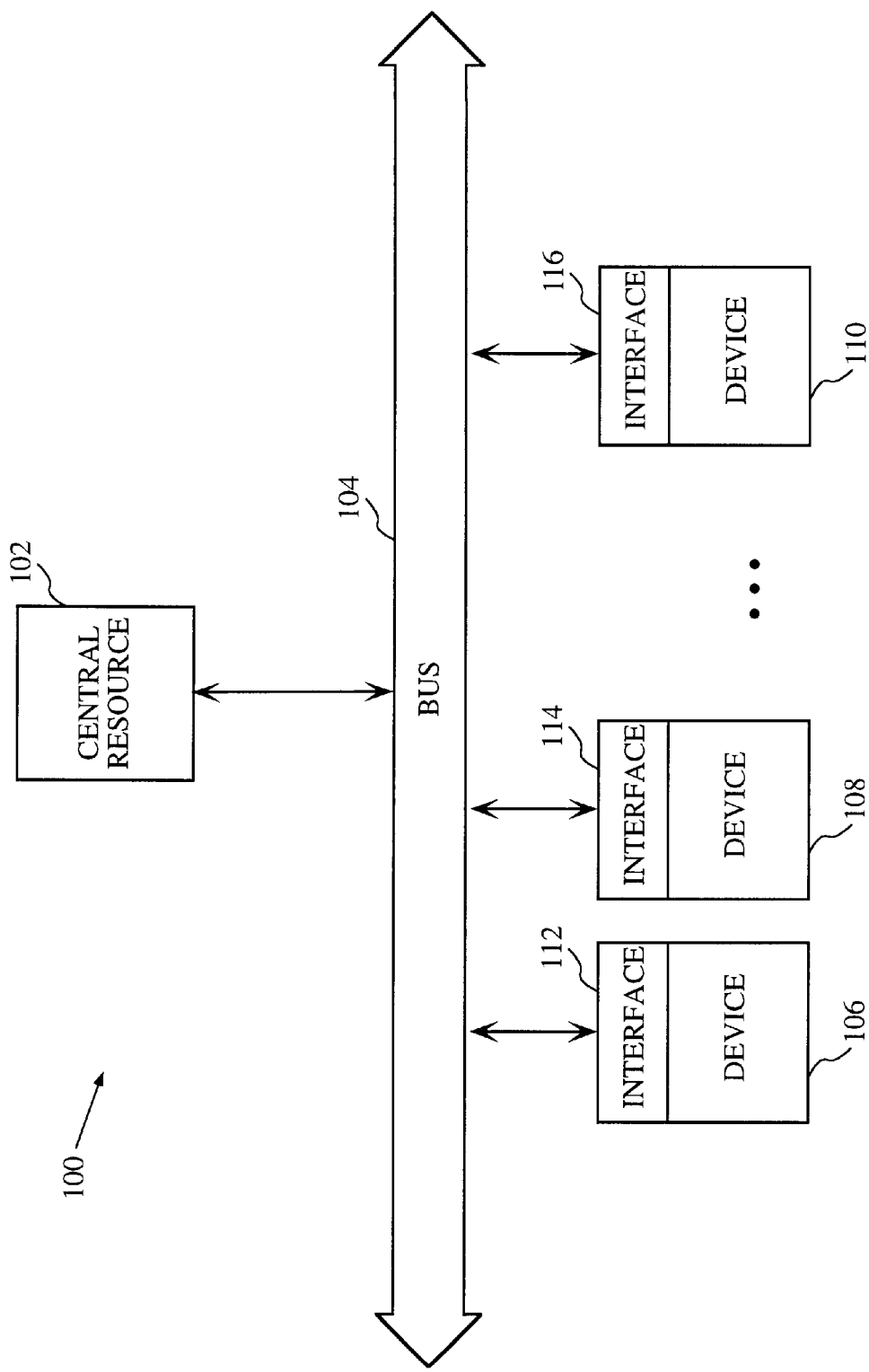
FIG. 1 is a functional block diagram of an example electronic system for which simulation may be desired.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of electronic systems that include application specific integrated circuits (ASICs), microprocessors, field programmable gate arrays (FPGAs) and other programmable logic. The invention has been found to be particularly beneficial in demonstrating the simulation of bus logic cores for FPGAs. While the present invention is not so limited, an appreciation of the present invention is presented by way of a particular example application, in this instance, in the context of simulating an example electronic system that includes bus core logic and multiple devices or "agents" coupled to the bus.

FIG. 1 is a functional block diagram of an example electronic system 100 for which simulation may be desired. The example system 100 includes a central resource 102, a bus 104, and example devices 106, 108, and 110. Each of the devices 106–110 includes respective interface logic 112, 114, and 116.

In an example system, the central resource 102 comprises a component with which one or more of the devices 106, 108, 110 communicates. For example, resource 102 may be a memory from and to which the devices can read and write data via bus 104. Alternatively, the resource may be a host processor which interfaces directly with the devices 106–110. The devices 106–110 may include network interfaces, SCSI interfaces and other example input/output channels.

Simulation may be desired for all or part of the system 100. For example, a vendor of bus core logic for bus 104 may desire to simulate a system that includes resource 102, bus 104, and an arbitrary device 106. In this description, the term "user" will be used to reference the one who is running the simulation of a system.

Bus 104 may be compliant with a particular standard, or may be an application specific bus. In either case, bus logic is used to implement the bus, wherein the bus logic includes interface logic 112 and logic that controls access to bus 104. When a user purchases logic that implements a particular bus architecture, the logic is often referred to as "bus core logic." The user that obtains bus core logic may also obtain a test bench that can be tailored to test the user's system.

The following figures illustrate an example system and method for demonstrating a test bench and bus core logic to a user. Generally, the process involves running a simulation and recording bus signal vectors during a first phase. In a second phase, the bus signal vectors are read and "played back" to demonstrate the simulation. It will be appreciated that during the first phase the system logic is exercised to generate and respond to the bus signals. During the second phase, the system logic neither generates nor responds to the bus signals. Playback logic outputs the bus signals at the appropriate times during the second phase.

Figure 2:
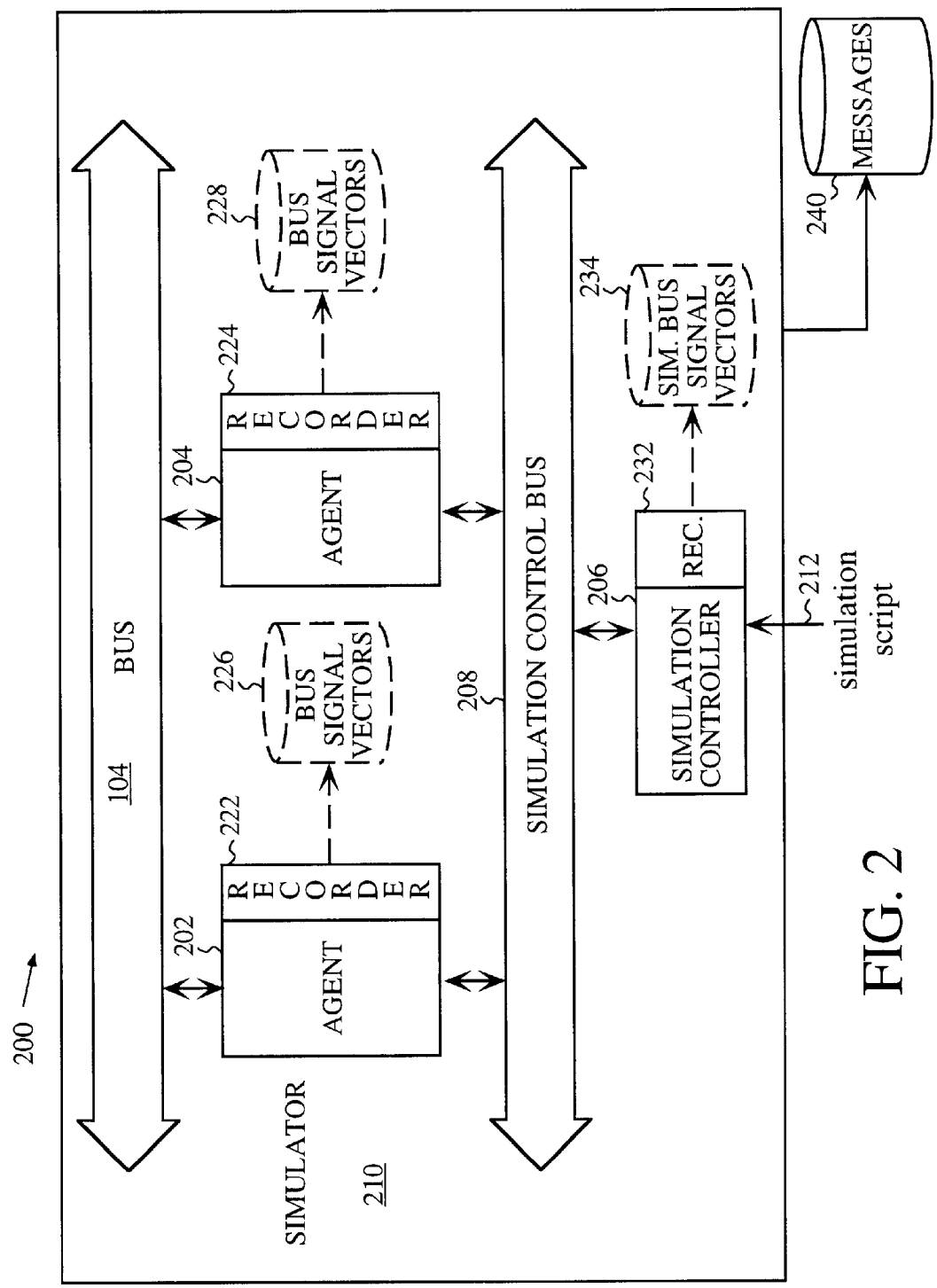
FIG. 2 is a block diagram of an example system in which operation of a bus and bus agents is simulated, and the simulation is recorded for future playback.

FIG. 2 is a block diagram of an example system 200 in which operation of a bus 104 and bus agents 202 and 204 is simulated, and the simulation is recorded for future playback. The system 200 includes bus 104 to which to example agents 202 and 204 are coupled. Bus 104 may also be referred to herein as the core logic bus. Simulation of the system is controlled by simulation controller 206 which communicates with agents 202 and 204 via a simulation control bus 208. Buses 104 and 208, along with agents 202 and 204 and simulation controller 206 are comprised of logic that is interpreted and whose functions are simulated by simulator 210. Simulator 210 is software such as Verilog—XL or ModelSim that is executable on a workstation, PC-compatible, or other processor-based computer.

Simulation controller 206 receives commands from a simulation script as shown by line 212. These simulation commands are interpreted by simulation controller 208, and the specified functions are performed. Simulation commands in the simulation script are translated into signals that are sent from simulation controller 206 to agents 202 and 204 and to the bus core logic via simulation control bus 208. For example, a write-memory simulation command may address one of agents 202 or 204 from simulation control bus 208 and store a value in the control memory (not shown) of the addressed agent. Generally, simulation controller 206 can address a special memory space reserved in each of the agents. The special memory space indicates to the agents the functions they are to perform on the core logic bus.

It will be appreciated that a test environment having a simulation control bus 208 is but one example of a test environment in which the present invention could be used. In another embodiment, a test driver logic module (not shown) could be coupled directly to the bus core logic and signals could be recorded for playback.

Simulation controller 206 also receives data from agents 202 and 204. For example, if simulation controller 206 sends a transaction to the bus core logic calling for a data transfer from a master agent 202 to a target agent 204, the master and target agents interact to effect the data transfer via bus 104. The data is written to a buffer (not shown) of the bus core logic for target agent 204. The buffer is addressable by simulation controller 206 over simulation control bus 208. Simulation controller 206 can read the data from the buffer to verify proper operation of the core in processing the transaction.

In the first phase of demonstrating the simulation, the bus signals generated by agents 202 and 204 and simulation controller 206 are recorded as bus signal vectors. In the example embodiment, each of agents 202 and 204 includes recorder logic sections 222 and 224, respectively. The recorder logic writes the bus signal vectors to respective bus signal vector files 226 and 228. Simulation controller 206 also includes a recorder logic section 232 which records simulation control bus 208 signals that it generates as simulation bus signal vectors in file 234. While not shown, it will be appreciated that agents 202 and 204 also write simulation control bus 208 signals as simulation bus signal vectors to respective files.

Simulator 210 also provides output of messages to a computer display (not shown) in order to indicate the progress of the simulation. The messages are also written to a log file 240. The messages in log file 240 and the recorded bus signal vectors in files 226, 228, and 234 are used in the second phase of demonstrating the simulation.

Those skilled in the art will recognize that in an alternative embodiment, recorder logic 222 and 224 in agents 202 and 204 could be implemented outside the agent logic. However, such an implementation must address events where an agent is not driving the bus either high or low, but is setting its drivers to high impedance. It will be recognized that high impedance states cannot be recorded off the bus, but must be recorded by looking at the logic states within the agent.

In another embodiment, both recorded and "live" agents can be provided, wherein a "live" agent is one that responds to input stimuli (bus signals). If demonstration of the functionality of a "live" bus agent is desired, the signals from such a live agent can be left unrecorded. That is, a bus agent that has no recorder logic is included in system 200. The agent without the recorder logic is replicated in the playback environment (see FIG. 3). For example, if the user wishes to demonstrate agent 204 as a live agent, he or she may simulate system 200 without recorder logic 224 and vectors 228. Then agent 204 will be replicated in a playback environment without associated playback logic or associated vectors. Agent 204 then functions as an active bus agent during the playback, just as it did during the recording of the simulation.

Figure 3:
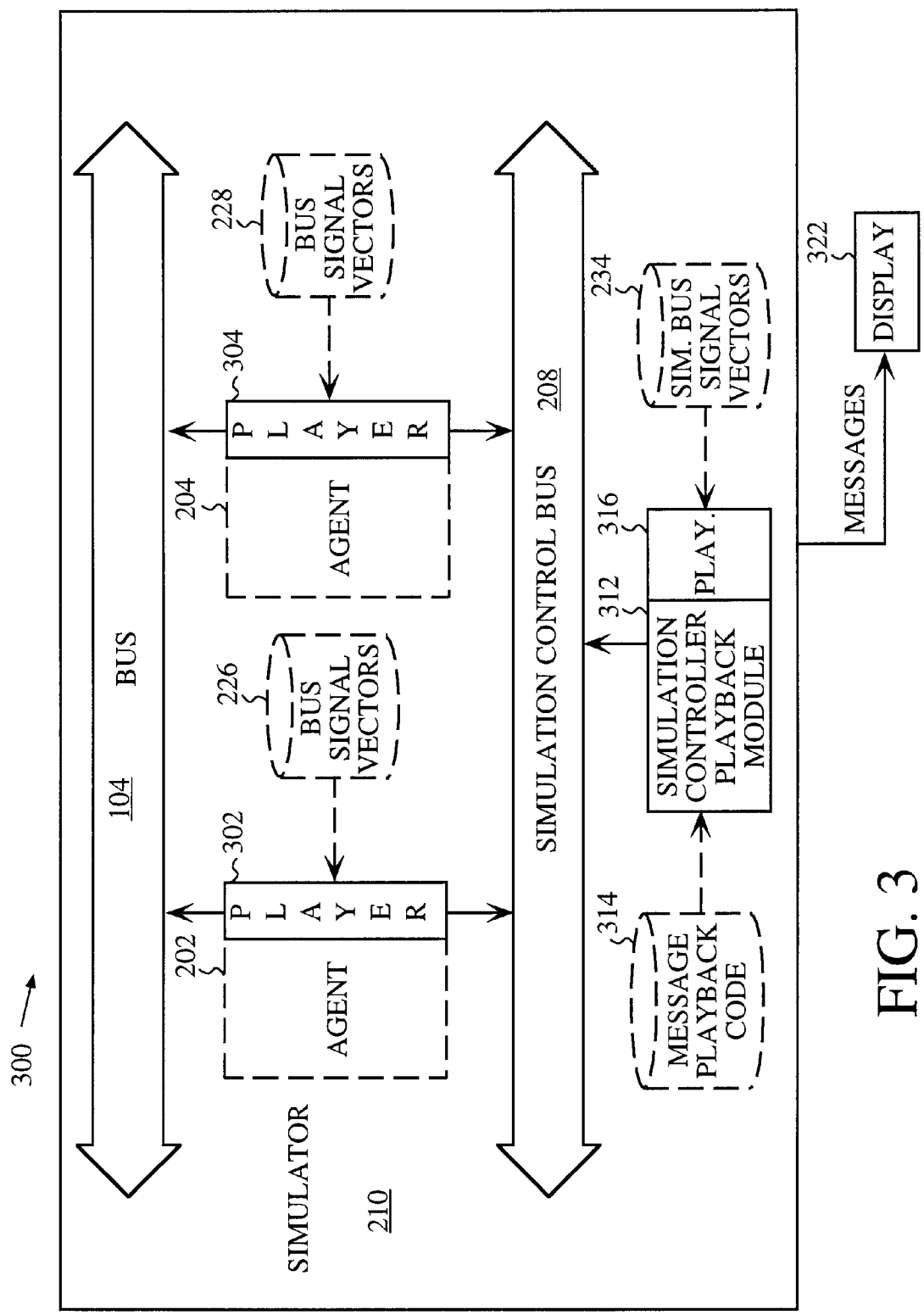
FIG. 3 is a block diagram of an example system in which a previously recorded simulation of operation of bus and bus agents is played back.

FIG. 3 is a block diagram of an example system 300 in which a previously recorded simulation of operation of bus 104 and bus agents 202 and 204 is played back. Agents 202 and 204 are shown to illustrate the simulation of the system being played back. In system 300, the logic of agents 202 may be either disabled or replaced. The player logic sections 302 and 304 take the place of the respective agents 202 and 204. Player logic section 302 reads the recorded bus signal vectors of agent 202 from file 226 and outputs the signals on buses 104 and 208 at the appropriate times. Similarly, player logic section 304 reads the bus signal vectors from file 228 for agent 204 and outputs the signals on buses 104 and 208 at the appropriate times. The bus signals are output on buses 104 and 208 during playback of the simulation so that the bus signals can be viewed with a waveform viewer (not shown) of simulator 210.

A simulation controller playback module 312 replaces simulation controller 206 that was used during recording of the simulation. Inputs to playback module 312 are message playback code 314 and the simulation bus signal vector file 234. Player logic 316 in the playback module reads simulation bus signal vectors from file 234 and outputs the signals at the appropriate times on simulation control bus 208. The operation of player logic 316 is similar to operation of player logic sections 302 and 304.

Prior to playback of the simulation, the simulation messages of log file 240 are translated to HDL code. The HDL code is read by playback module 312 and interpreted by simulator 210. In the example embodiment, the timestamps associated with the messages in log file 240 are used to generate HDL delay statements that are written to playback code file 314. HDL display statements are written to playback code file 314 along with the text of the messages. During the playback phase, the code is read from playback code file 314 and executed. A delay statement causes the simulator to wait a specified period of time, and a display statement causes the simulator to output the text parameter associated with the display statement as a message to a computer display 322, for example. Thus, the messages recorded in log file 240 during simulation are output at the appropriate time during playback of the simulation.

As mentioned above in reference to FIG. 3, if demonstration of a live agent is desired in the playback of the simulation, a live bus agent can be included in system 300. The live bus agent does not include any player logic and responds to bus signals as programmed, as compared to reading signal vectors from a file and outputting bus signals at the appropriate time. For example, if it is desirable to demonstrate agent 204 of FIG. 2 as a live agent during playback, system 200 will have been simulated without recorder logic 224 and vectors 228. Then agent 204 is replicated in playback environment 300 of FIG. 3 without playback logic 304 and associated vectors 228.

Figure 4A:
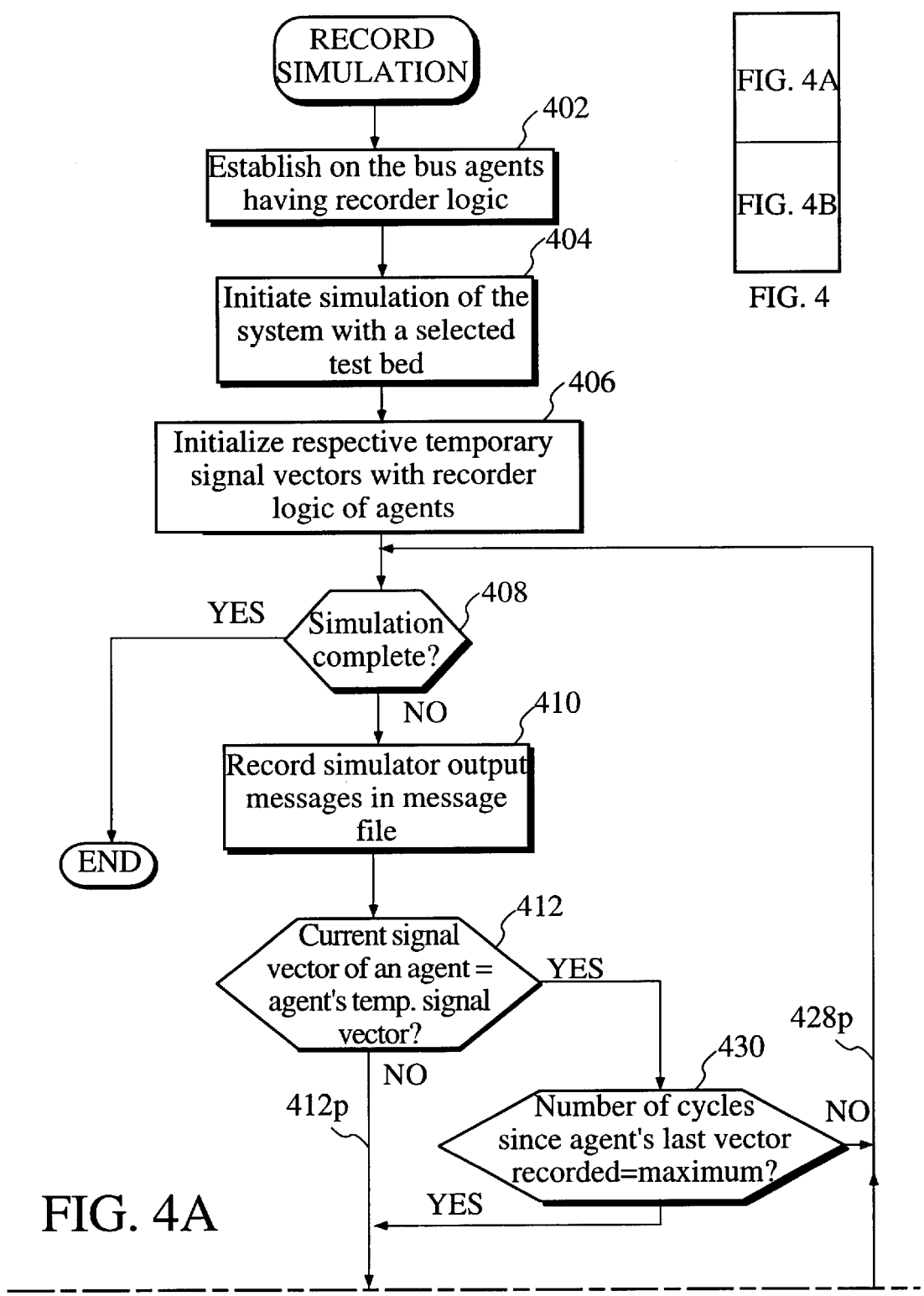
FIG. 4 (comprising FIGS. 4A and 4B) is a flowchart of a process for recording a simulation, according to an example embodiment of the invention.
Figure 4B:
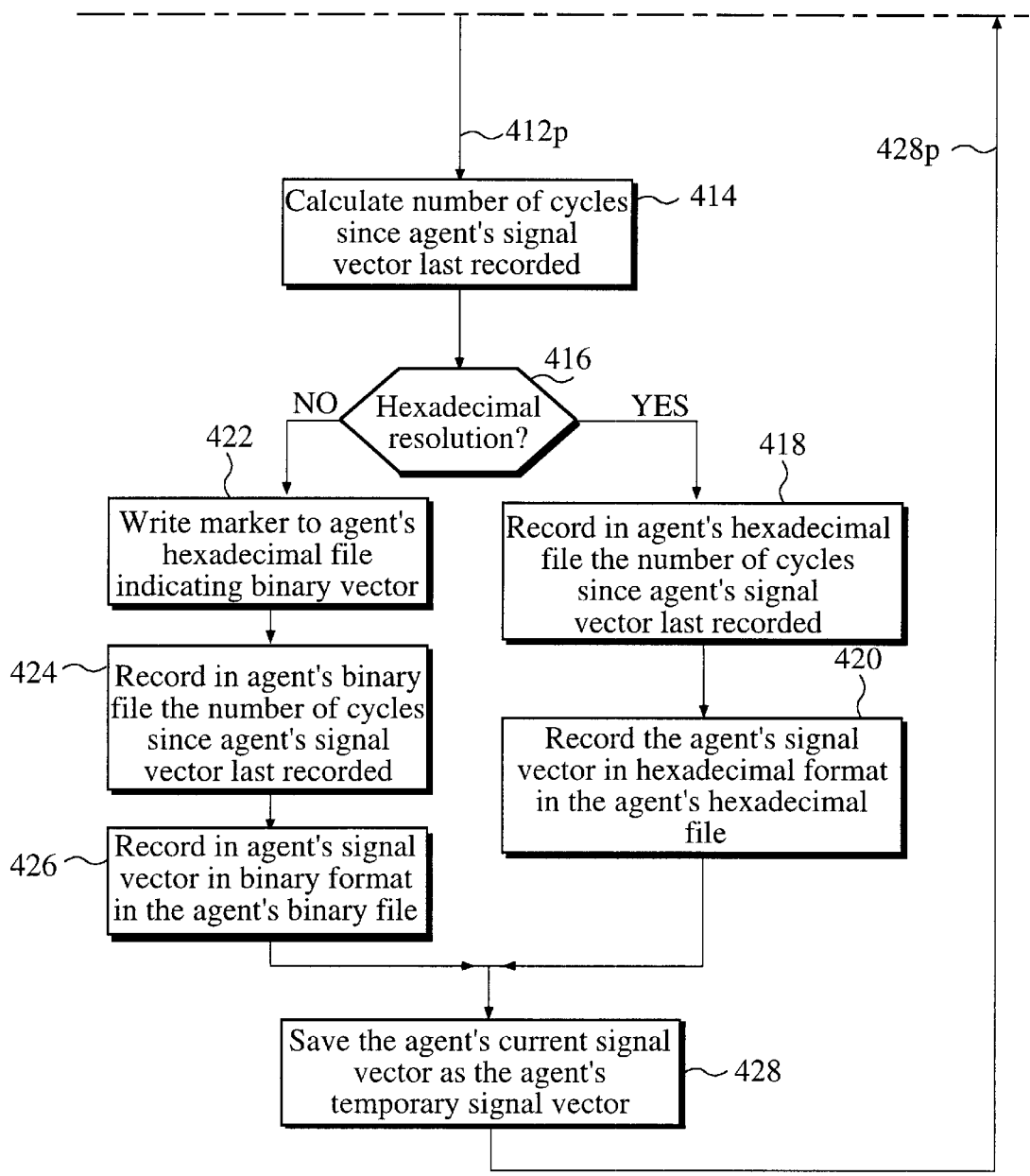

FIG. 4, comprising FIGS. 4A and 4B, is a flowchart of a process for recording a simulation, according to an example embodiment of the invention. The bus agents whose behavior is to be simulated are instantiated on a bus at step 402. In the example embodiment, the agents include recorder logic to record the generated bus signals. The instantiation encompasses preparing the HDL for the agents and recorder logic and compiling the logic along with the bus logic.

At step 404, the simulation is initiated with a selected test bed. For example, the test environment of FIG. 2 includes a simulation control bus 208 and a simulation controller 206 that drives the simulation as defined by the simulation script.

At step 406, the recorder logic 222 and 224 of each of agents 202 and 204 initialize respective signal vectors. The temporary signal vectors are used in a compression process for reducing the number of signal vectors recorded during simulation. As shown by step 408, the process of recording the simulation continues until the simulation is complete.

As shown by step 410, the simulator output messages are written to the log file during the simulation. Steps 412 430 show processing performed by each of the example recorder logic elements 222, 224, and 232 during the simulation.

Agents 202 and 204 and simulation controller 206 generate bus signals in response to the input simulation script. Each time that an agent (or simulation controller) drives a set of signals (a "signal vector") onto one of buses 104 and 208, that current signal vector is compared to the agent's temporary signal vector. The temporary signal vector is the last signal vector recorded for the agent. If the current signal vector is not equal to the temporary signal vector, the current signal vector is recorded in the associated signal vector file (226, 228, or 234).

At step 414, the process of recording the signal vector begins. Step 414 calculates the number of bus cycles since the last signal vector was recorded for the agent on the particular bus. This number of bus cycles is used during playback to output the bus signals at the appropriate time.

Step 416 tests whether the signal vector can be represented in hexadecimal format. It will be recognized that in some circumstances certain ones of the bus wires may be in an indeterminate state or may be tristated. In such instances, the logic state of the wires is neither logic level 0 nor logic level 1. Thus, the set of bus signals cannot be represented in hexadecimal format. For example, if the bus has 8 wires and the binary state of the wires is "0101 1101", the state of the bus can be represented in hexadecimal format with the bus vector "5D." However, if the state of the wires is "00x1 1z00", the state of the bus cannot be represented in hexadecimal format. Instead, the signal vector is represented in binary format as "00x1 1z00", where the "x" and "z" are interpreted by the simulator. It will be appreciated that the "x" can represent an indeterminate state and "z" can represent a tristate value.

In the example embodiment, signal vectors in hexadecimal format are written to a first file and signal vectors in binary format are written to a second file. Note that signal vector files 226, 228, and 234 of FIG. 2 are intended to cover such an embodiment. If the signal vector can be recorded in hexadecimal format, step 416 directs processing to step 418. at step 418, the number of cycles since the last signal vector was recorded for the agent for the particular bus is written to the signal vector file. Following this "duration value," at step 420, the signal vector is written in hexadecimal format to the signal vector file.

If the signal vector requires a binary representation, step 416 directs processing to step 422. At step 422, a marker is written to the hexadecimal file to indicate that during playback the next signal vector is to be output is read from the binary file instead of the hexadecimal file. At step 424, the number of cycles since the last signal vector was recorded for the agent for the particular bus is written to the binary signal vector file. At step 426, the signal vector is written in binary format to the signal vector file.

While the above described embodiment includes a hexadecimal vector file as the main vector file, other numeric bases could be used. For example, where non-bus signals are represented, it may be desirable to use only a binary vector file. If only a binary vector file were used, then steps 416–426 could be simplified to recording the signal vector in the binary (or other suitable base number) vector file.

It will be appreciated from the foregoing that the example format of an agent's hexadecimal signal vector file is generally: duration$_1$; vector$_1$; duration$_2$; vector$_2$; duration$_3$; vector$_3$; . . . ; marker; duration$_{n-1}$; vector$_{n-1}$; duration$_n$; vector$_n$. The binary file is structured similarly, but does not include any marker values. Each of the duration values indicates to the associated one of the player logic sections 302, 304, or 316 how long to wait before outputting the next vector. When the marker in the hexadecimal file is encountered during playback, the player logic reads the next duration and vector from the binary file.

At step 428, the agent's temporary signal vector is replaced with the agent's current signal vector, and processing returns to step 408.

Returning now to step 412, if the agent's current signal vector has not changed from the previously recorded signal vector (the temporary signal vector), the current signal vector may not need to be recorded. Recording an agent's signal vector only when it has changed reduces the storage required for recording the simulation.

Figure 5:
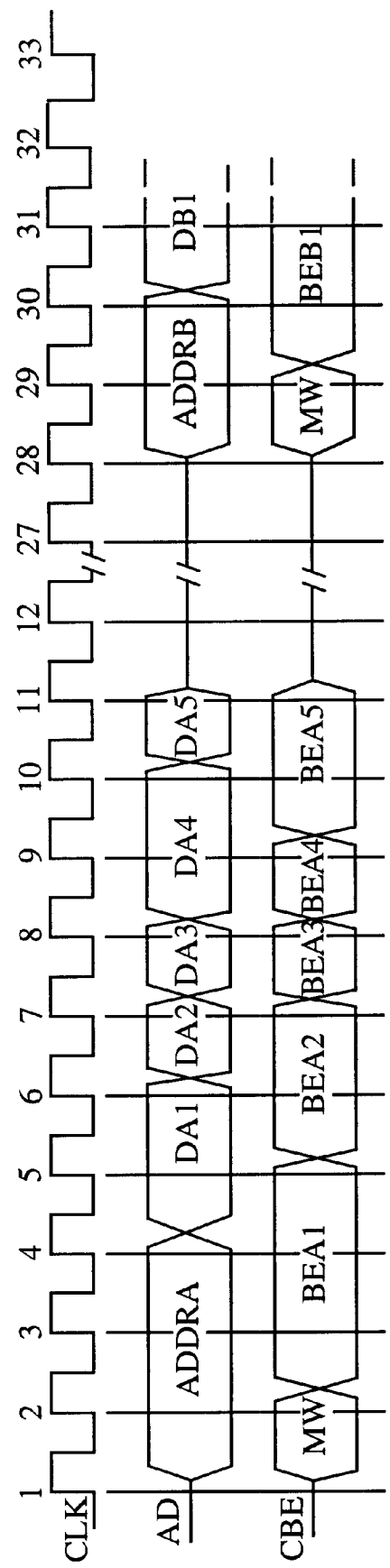
FIG. 5 is a timing diagram showing the states of selected bus signals.

Referring now to FIG. 5, a timing diagram is shown that illustrates the states of selected bus signals, for example from a PCI bus. The CLK line illustrates the clock pulses that demarcate bus cycles. The AD signal line represents the states of address and data lines of the bus, and the CBE line represents control and byte enable lines of the bus.

FIG. 5 can be used to illustrate how the example simulation recording process reduces the storage required to record signal vectors. The first signal vector is recorded at CLK cycle 2. Note that the signal vector includes the states of the AD and CBE signals. Those skilled in the art will recognize that additional signals could also be recorded, depending upon simulation requirements. The duration associated with the first signal vector is 1 as calculated from CLK cycle 1. Because the states of the AD and CBE signals change from cycle 2 to cycle 3, a signal vector is also recorded at cycle 3. Note that from cycle 3 to cycle 4, the state of the AD and CBE signals do not change. Therefore, no signal vector is recorded at cycle 4. It will be appreciated that signal vectors are thereafter recorded at cycles 5, 6, 7, 8, 9, 10, 11, 12, 29, 30, and 31.

Note that no signal vectors are recorded between cycle 12 and cycle 29 when the agent is idle on the bus. This substantially reduces the storage required for recording the signal vectors of a simulation.

Returning now to step 412 of FIG. 4A, as explained above, agents only record signal vectors when the current signal vector is different from the previously recorded signal vector. However, the duration for which the agent can refrain from recording signal vectors is limited by the number of bits allocated to represent the duration values. For example, if the number of bits used to represent the duration is 12, the maximum duration that can be recorded is 4096. Therefore, when this maximum value is reached, step 430 directs processing to step 414 and the signal vector is recorded. It will be appreciated that the method of the example embodiment for compressing the signal vectors does not require any additional processing for decompression during the playback of the simulation.

Before playback of the simulation, the messages of log file 240 (FIG. 2) are translated into HDL code.

Figure 6:
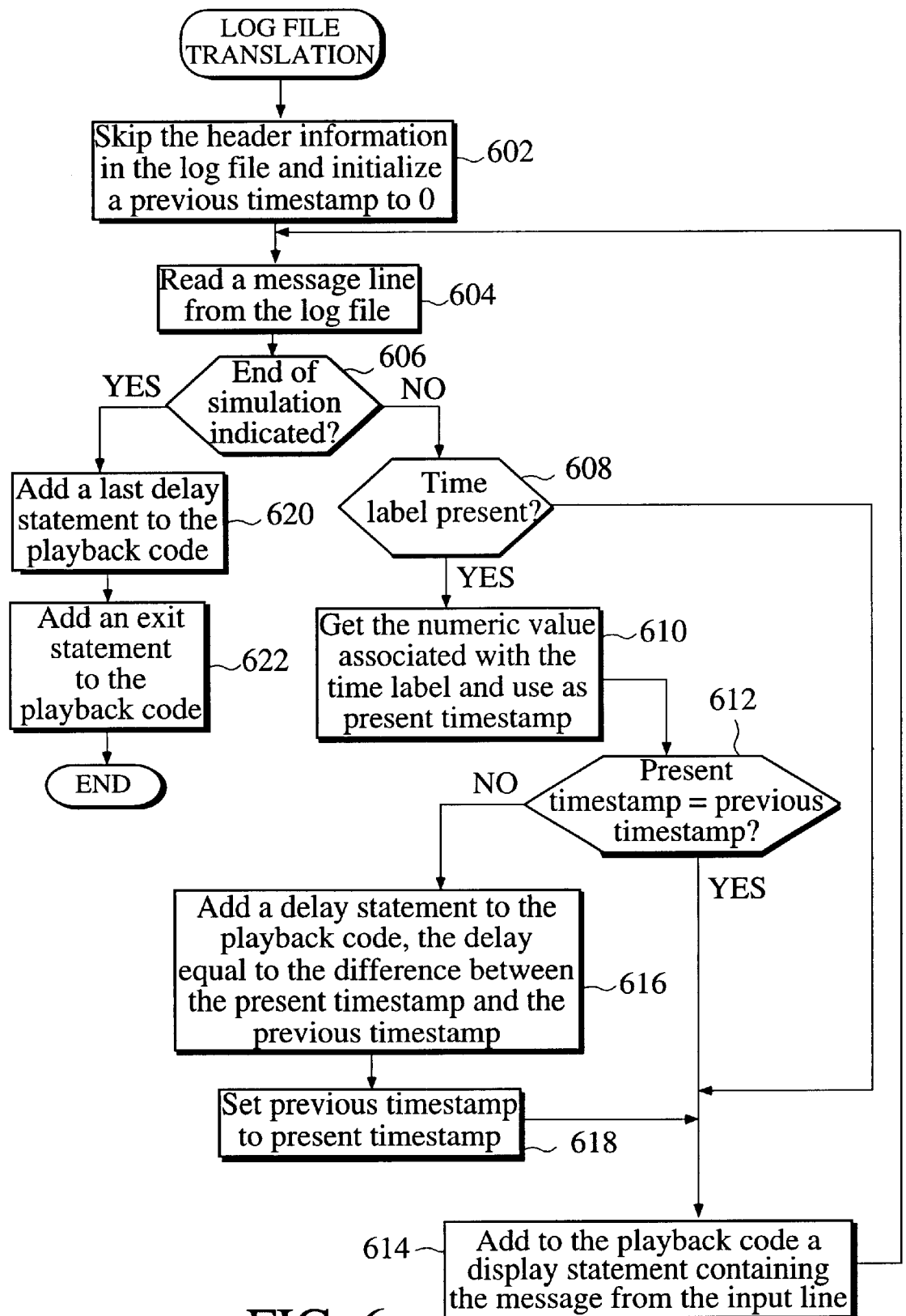
FIG. 6 is a flowchart of the processing performed in translating the recorded simulation messages into HDL code.

FIG. 6 is a flowchart of the processing performed in translating the recorded simulation messages into HDL code. Such a process can be implemented with a nawk script, for example. (Nawk is an enhanced version of the well known awk command interpreter used in UNIX.) Generally, lines of text are read from log file 240, timestamps associated from the messages are used to generate delay statements, and the message text is used to generate display statements.

At step 602, the process skips past the header information in the log file, and a previous timestamp is initialized to 0. Such header information will vary from implementation to implementation. Once past the header, at step 604, a message line is read from the log file and step 606 continues the process until a message is reached that indicates the simulation is complete.

Each line of text is checked for the presence of a time label at step 608. For example, a label of ns represents nanoseconds. It will be appreciated that other labels, such as, ps, for picoseconds may be used. A time label indicates that the message should be output during playback at the appropriate time, and the associated time value indicates when the message was output during the simulation.

If the line of text has a time label, at step 610 the numeric value that is associated with the time label is obtained. The time value is used as a present timestamp during the process. If the present timestamp is equal to the previous timestamp (that is the timestamp of the previous message), the message is output during playback without any delay. Output of the message during playback of the simulation is accomplished with a display statement, which is added to the playback code file at step 614. The message obtained at step 604 is used as a parameter for the display message. Processing then returns to step 604 to get the next line of text from the log file.

If the present timestamp does not equal the timestamp of the previous message, output of the associated message is delayed. Step 612 directs control to step 616, where a delay value is computed as the difference between the present timestamp and the previous timestamp, and a delay statement with the delay value is written to the message playback code file 314. The delay statement causes the simulation controller playback module 312 to delay output of the message for the period of time separating the present timestamp from the previous timestamp. The present timestamp is then used as the previous timestamp, as shown by step 618, and processing is directed to step 614 as described above.

Processing of lines of data from log file 240 continues until the end of the simulation is indicated. For example, the simulator may write a message "SIMULATION PASSED!" in the log file. It will be appreciated that there may be additional trailer information at the end of the log file, which is not used for the present invention. When the end of the log file is reached, an optional final delay statement and then an exit statement are written to the playback code file 314, as shown by steps 620 and 622. The exit statement causes the simulator to stop the playback of the simulation.

Figure 7:
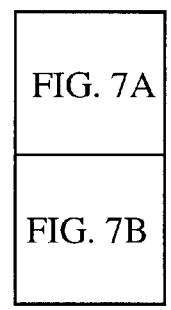
FIG. 7 (comprising FIGS. 7A and 7B) comprises a flowchart of processing performed to playback a simulation in accordance with an example embodiment of the invention.
Figure 7A:
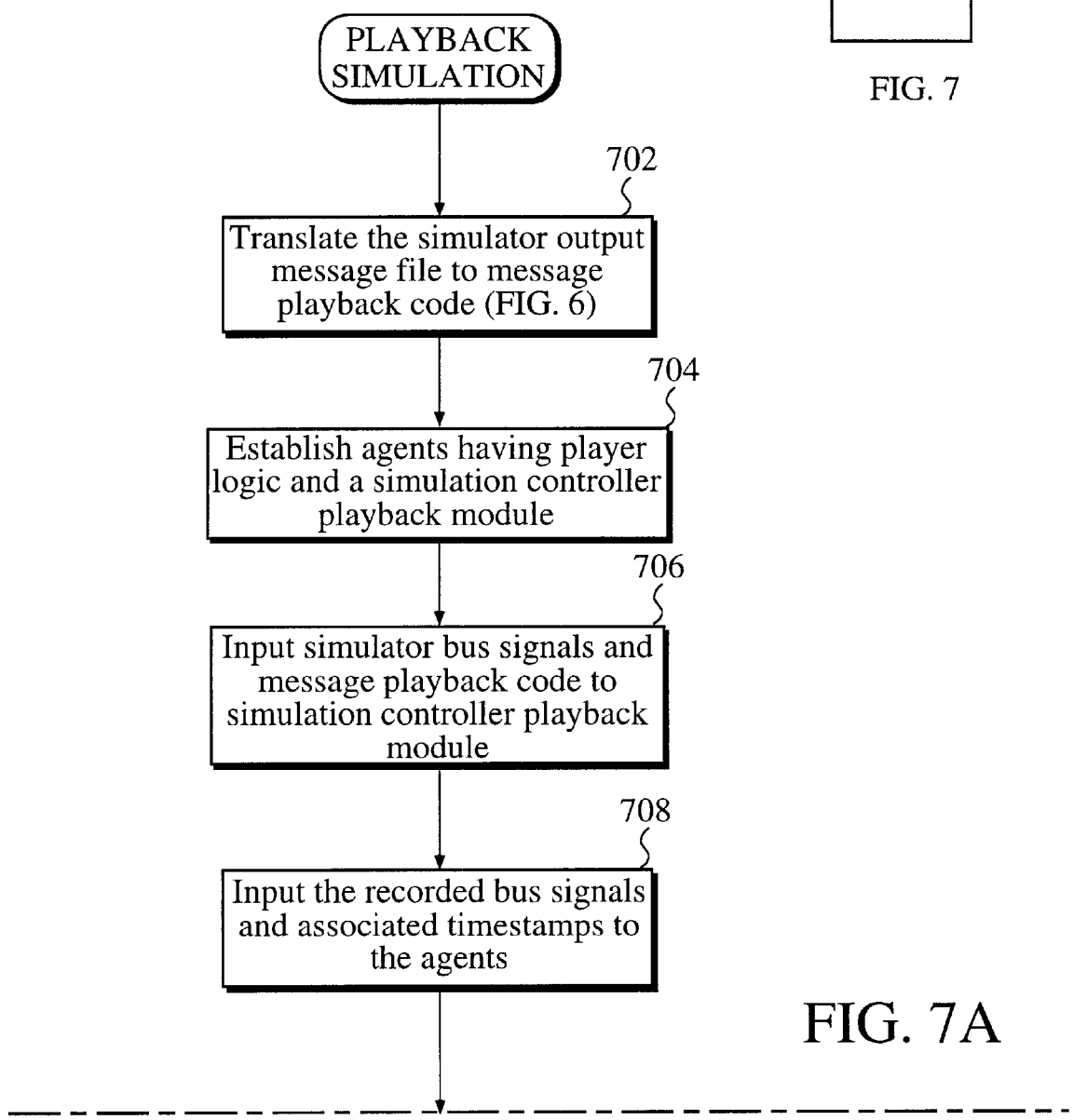
Figure 7B:
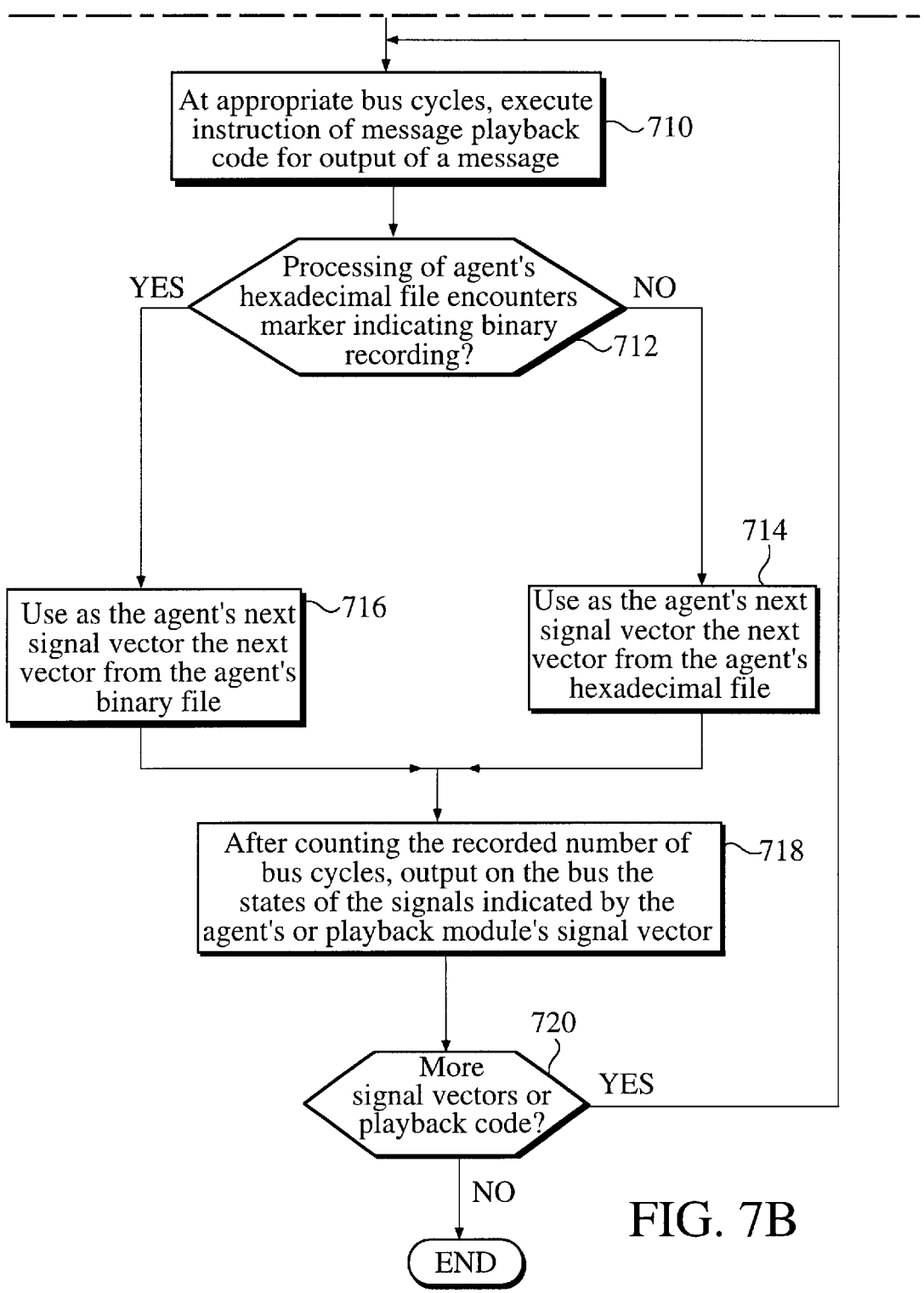

FIG. 7 (comprising FIGS. 7A and 7B) is a flowchart of processing performed to play back a simulation in accordance with an example embodiment of the invention. The process generally comprises processing the playback code 314 and simulation bus vectors 234 by playback module 312, and processing signal vector files 226 and 228 by the respective player logic sections 302 and 304. At step 702, the message playback code is generated as described above.

At step 704, the agents with player logic 302 and 304, along with simulation controller playback module 312 are instantiated by simulator 210. As shown by steps 706 and 708, playback of the simulation begins with the input of simulation bus signal vectors 234 and message playback code 314 to simulation controller playback module 312 and the input of bus signal vectors 226 and 228 to player logic 302 and 304. While not shown, it will be understood that player logic sections 302 and 304 may also input signal vectors from additional signal vector files that are associated with simulation bus 208.

While not separately shown in the flowchart, player logic 302 and 304, simulation controller playback module 312, and player logic 316 all operate concurrently within simulator 210. Therefore, the sequential flow illustrated by the flowchart should not be construed as limiting the invention, and it will be understood that some of the steps may be performed concurrently.

At step 710, simulation controller playback module 312 processes an instruction from message playback code 314. Recall that playback code 314 in the example embodiment includes delay and display statements. When the simulation controller playback modules encounters a delay statement, further processing of playback code is delayed by the specified number of bus cycles. A display statement causes the simulator 210 to output a message to a computer display 322, for example.

Steps 712–718 illustrate the processing performed by the respective player logic sections 302, 304, and 316. Generally, the player logic sections read duration values and signal vectors from the respective hexadecimal signal vector files. Recall that only one signal vector file per player logic section is illustrated in FIG. 3, even though in various implementations there may be two or more signal vector files per player logic section. For example, each player logic section may have respective hexadecimal and binary vector files for both bus 104 and simulation control bus 208.

Unless the player logic encounters a marker in the hexadecimal vector file, step 712 directs processing to step 714 where the player logic uses the next signal vector in the associated hexadecimal file for output on the bus. If a marker is encountered in the hexadecimal file, processing is directed to step 716. At step 716, the player logic uses the next signal vector in the binary signal vector file for output on the bus.

Step 718 illustrates processing by the player logic for output of a signal vector recorded in a simulation. As described above, a bus signal vector file includes a sequence of duration values and signal vectors, where each signal vector has an associated duration value. The processing of a signal vector therefore includes waiting the number of bus cycles indicated by the duration value and then outputting the signal vector on the bus. The process is repeated for each signal vector.

As long as there are more signal vectors to process or more playback code to process, step 720 returns processing to step 710.

Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method for simulating operation of a communications bus, comprising:
   simulating operation of a system that includes a communications bus, a first bus agent, a second bus agent, and recorder logic;
   recording with the recorder logic bus signals of the first and second agents as signal vectors;
   substituting playback logic for the recorder logic; and
   outputting during playback the signal vectors recorded for the first and second agents as bus signals by the playback logic.

2. The method of claim 1, further comprising compressing the signal vectors before recording.

3. The method of claim 2, further comprising for each agent:
   (a) recording a base signal vector, the base signal vector representing a set of states of the bus signals during a base interval of time;
   (b) detecting a change in state of any of the signals of the base signal vector, wherein the change is detected for states of the signals as present during a second interval of time;

(c) recording a duration value for a duration of time between the base interval and the second interval;

(d) recording a new signal vector with the states of the bus signals as present during the second interval; and (e) repeating the steps (b)–(d) using the new signal vector as the base signal vector and the second interval as the base interval.

4. The method of claim 3, further comprising:

(f) reading a recorded signal vector as a playback signal vector;

(g) reading a duration value associated with the playback signal vector;

(h) providing on the bus for a duration of time indicated by the duration value signals represented by the playback signal vector; and (i) repeating steps (f)–(h).

5. The method of claim 1, further comprising:

recording selected first ones of the signal vectors in hexadecimal format; and recording selected second ones of the signal vectors in binary format.

6. The method of claim 5, wherein the first ones of the signal vectors are recorded in a first file, and the second ones of the signal vectors are recorded in a second file.

7. The method of claim 6, further comprising writing a selected code in the first file that indicates when a signal vector is written to the second file.

8. The method of claim 1, wherein the bus is a PCI bus.

9. The method of claim 1, further comprising:

writing simulation messages to a log file while simulating operation of the system; and providing as output during the playback the messages from the log file.

10. The method of claim 9, further comprising translating messages in the log file to HDL code.

11. The method of claim 10, further comprising translating timestamps associated with the messages and the messages to HDL delay statements and HDL display statements.

12. The method of claim 11, further comprising compressing the signal vectors before recording.

13. The method of claim 12, further comprising for each agent:

(a) recording a base signal vector, the base signal vector representing a set of states of the bus signals during a base interval of time;

(b) detecting a change in state of any of the signals of the base signal vector, wherein the change is detected for states of the signals as present during a second interval of time;

(c) recording a duration value for a duration of time between the base interval and the second interval;

(d) recording a new signal vector with the states of the bus signals as present during the second interval; and (e) repeating the steps (b)–(d) using the new signal vector as the base signal vector and the second interval as the base interval.

14. The method of claim 13, further comprising:

(f) reading a recorded signal vector as a playback signal vector;

(g) reading a duration value associated with the playback signal vector;

(h) providing on the bus for a duration of time indicated by the duration value signals represented by the playback signal vector; and (i) repeating steps (f)–(h).

15. A method for recording a simulation of a system including a communications bus, comprising the steps of:

simulating operation of a system that includes a communications bus, a first bus agent, a second bus agent, and recorder logic;

recording respective base signal vectors for the bus agents, each base signal vector representing a set of states of the bus signals during a respective base interval of time;

(a) detecting a change in state of any of the signals of the base signal vector, wherein the change is detected for states of the signals as present during a second interval of time;

(b) recording a duration value for a duration of time between the base interval and the second interval;

(c) recording a new signal vector with the states of the bus signals as present during the second interval; and (d) repeating the steps (a)–(c) using the new signal vector as the base signal vector and the second interval as the base interval.

16. A system for recording simulation of a communications bus, comprising:

a simulator;

bus logic defining operation of the communications bus and hosted by the simulator;

a plurality of bus agent logic elements interfaced with the bus logic and hosted by the simulator, each bus agent logic element including recorder logic arranged to store signal vectors representing bus signals output by the bus agent logic element; and a simulation controller interfaced with the plurality of bus agent logic elements and arranged to exercise selected usage of the bus by the bus agent logic elements.

17. The system of claim 16, further comprising logic in the recorder logic to compress the signal vectors prior to storage.

18. A system for demonstrating a simulation of a communications bus, comprising:

a simulator;

bus logic defining operation of the communications bus and hosted by the simulator;

a plurality of stored signal vectors, each signal vector representing bus signals output during an associated interval of time during the simulation; and a plurality of player logic elements interfaced with the stored signal vectors and with the bus logic, and hosted by the simulator, each player logic element arranged to read respectively associated ones of the signal vectors and provide the associated signal vectors as bus signals at the associated intervals of time.

19. The system of claim 18, further comprising:

a plurality of stored messages logged during the simulation;

a message translator interfaced with the stored messages and arranged to generate playback code for the stored messages, wherein execution of the playback code results in output of the messages during demonstration of the simulation; and a playback controller arranged to receive as input the playback code and interpret the code.

20. An apparatus for demonstrating a simulation of a communications bus, comprising:

means for simulating operation of a system including a bus and a plurality of bus agents;

means for recording signal vectors respectively generated by the bus agents during simulation;

means for reading during playback of the simulation the signal vectors recorded during the simulation; and means for providing as output on the bus the signal vectors read during playback.

21. The apparatus of claim 20, further comprising:

means for recording simulator output messages generated during the simulation;

means for reading during playback of the simulation the messages recorded during the simulation; and means for providing as output during the playback the simulator output messages.

22. A method for simulating operation of a communications bus, comprising:

simulating operation of a system that includes a communications bus, a first bus agent, a second bus agent, and recorder logic;

recording with the recorder logic bus signals of the first agent as signal vectors;

substituting playback logic for the recorder logic;

outputting during playback the signal vectors recorded for the first agent as bus signals by the playback logic; and simulating operation of the second agent.

* * * * *